(12) United States Patent
Horng

(10) Patent No.: US 7,544,885 B2
(45) Date of Patent: Jun. 9, 2009

(54) ISOLATING COVER

(76) Inventor: Chin-Hsing Horng, No. 2, Alley 8, Lane 2, Min-Sheng North Road Sec. 1, Kuei-Shan Town, Taoyuan County (TW)

(*) Notice: Subject to any disclaimer, the term of this patent is extended or adjusted under 35 U.S.C. 154(b) by 217 days.

(21) Appl. No.: 11/395,892

(22) Filed: Apr. 3, 2006

(65) Prior Publication Data

US 2006/0284712 A1   Dec. 21, 2006

(51) Int. Cl.
*H05K 9/00* (2006.01)
(52) U.S. Cl. .................... 174/35 R; 361/816
(58) Field of Classification Search ............. 174/35 R; 361/816; 336/90
See application file for complete search history.

(56) References Cited

U.S. PATENT DOCUMENTS

| | | | | |
|---|---|---|---|---|
| 4,750,090 A | * | 6/1988 | Abe | 361/741 |
| 6,178,097 B1 | * | 1/2001 | Hauk, Jr. | 361/816 |
| 6,872,880 B2 | * | 3/2005 | King et al. | 174/372 |
| 6,949,706 B2 | * | 9/2005 | West | 174/384 |
| 7,109,411 B2 | * | 9/2006 | Vinokor et al. | 174/350 |
| 7,208,675 B2 | * | 4/2007 | Horng | 174/377 |

FOREIGN PATENT DOCUMENTS

JP           01-241138      *  9/1989

* cited by examiner

*Primary Examiner*—Michael C Zarroli

(57) ABSTRACT

An isolating cover includes a cover plate and a base integrally coupled with each other. The base comprises a base body formed by four inverted-L-shaped frame members, at least one small protruded dot disposed at each external side of the frame members, and at least one pair of soldered pins disposed at the lower edge of the base, wherein a rectangular or wide L-shaped hole is disposed in the middle of the base body and some grooves are disposed at four corners, at two internal edges, or at each internal edge of the rectangular or wide L-shaped hole. The cover plate is a plate body, wherein some protruded boards are disposed at four corners, at two external edges or at each external edge thereof, and a notch is disposed at an external edge thereof for prying open the plate body.

3 Claims, 4 Drawing Sheets

ISOLATING COVER

BACKGROUND OF THE INVENTION

1. Field of the Invention

This invention relates to an isolating cover, and more particularly to an isolating cover that requires only a continuous mold, a metal sheet, and a consistent manufacturing procedure for installing or removing its cover plate conveniently to facilitate its maintenance and repair.

2. Description of the Related Art

Referring to FIGS. 7 and 8 for the prior art isolating cover 2 of a mobile phone or a similar product, the isolating cover 2 is manufactured through two molds by punching two metal sheets into a base 21 and an upper casing 22 integrally coupled with each other.

When the isolating cover 2 is installed to a mobile phone or a similar product, the isolating cover 2 covers some of the electronic or computer components. In case of failures or damages occurred in an electronic or computer component, the upper casing 22 of the isolating cover 2 is lifted for examining or replacing the damaged components. After the repair or maintenance is finished, the upper casing 22 of the isolating cover 2 is shut to resume the original functions and effects of the mobile phone or similar product. Therefore, mobile phone or similar product manufacturers generally manufacture a base 21 and an upper casing 22 separately as shown in FIG. 8. The base 21 includes a seat member 210 enclosed by an iron frame 211, and the external side of each frame 211 of the seat member 210 includes at least one small protruded dot 212, and the upper casing 22 includes a cover member 220 comprised of a board member 221 having a vertical flange 222 separately disposed on each side of the periphery, and the vertical flange 222 disposed at each side of the periphery of the cover member 220 includes at least one small hole 223 corresponding to the size and position of the small protruded dot 212 at each side of the frame 211 of the seat member 210 of the base 21, such that when the upper casing 22 is engaged with the base 21, the plurality of small protruded dots 212 on the seat member 210 are integrally secured to the small holes 223 to make the upper casing 22 covered on the base 21 without having the risk of being loosened or fallen off. However, the seat member 210 includes at least one pair of soldered pins 213 disposed at the lower edge of the frame 211 and soldered to a baseboard (not shown in the figure) of the mobile phone or the similar product. If the electronic or computer component disposed on the baseboard and covered by the isolating cover 2 is failed or damaged, the vertical flange 222 at the edge of the cover member 220 of the upper casing 22 of the isolating cover 2 is forced to open, such that the small hole 223 is separated from the small protruded dot 212 at the external side of the frame 211 of the seat member 210 of the base 21, and then the cover member 220 is lifted upward and opened to remove the upper casing 22 from the base 21 for the maintenance or repair of the electronic or computer component covered by the isolating cover 2. After the maintenance or repair is completed, the deformed section of the outwardly opened vertical flange 222 of the cover member 220 of the upper casing 22 is moved back to its position and soldered onto the seat member 210 of the base 21 on the baseboard, and the small protruded dots 212 on each external side of the frame 211 of the seat member 210 are engaged back to the small holes 223 at the corresponding positions on the vertical flange 222 of the cover member 220. Therefore, the upper casing 22 and the base 21 can integrally be secured with each other as a brand new isolating cover and will not be loosened or fallen off.

The application or maintenance of the prior art isolating cover 2 installed on the mobile phone or similar products seems to be working properly, but as the present technology advances, the quality requirements and quality control in the electronic or computer industry become stricter, the quality of products gets better, and the failure rate becomes very low, a vast majority of mobile phone or similar product manufacturers consider manufacturing an isolating cover 2 by using two metal sheets and two separate molds to make the upper casing 22 and base 21 as a waste of material and production costs, since the material cost for making the upper casing 22 is added, and the manufacturing process also increases the manufacturing cost by 50% or even doubles the cost. Therefore, the prior art isolating cover definitely requires improvements.

SUMMARY OF THE INVENTION

In view of the shortcomings of the prior art isolating cover 2 that is made by punching two metal sheets to form the base 21 and the upper casing 22, increases the material and production cost of the upper casing 22, makes the manufacturing process more complicated, and greatly increases the production cost, the inventor of the present invention invented the isolating cover in accordance with the present invention to overcome the shortcomings of the prior art.

Therefore, a primary objective of this invention is to provide an isolating cover that comprises a cover plate and a base integrally coupled with each other, wherein the base comprises a base body formed by four inverted-L-shaped frame members, at least one small protruded dot disposed at each external side of the frame members, and at least one pair of soldered pins disposed at the lower edge of the frame members.

The base body of the base is made by punching a rectangular or wide L-shaped hole in the middle of a metal sheet and then the remaining part of the metal sheet (i.e. the rectangular or wide L-shaped metal sheet) is directly used as a plate body of the cover plate. The plate body is engaged to the base body of the base which is integrated with each other.

The plate body of the cover plate comprises a plurality of protruded boards installed at the four corners, or installed at two external edges or at each external edge respectively, and a notch disposed at an external edge of the plate body and provided for users to pry open the cover plate from the base. The base body comprises grooves having the same size, shape, and quantity of the foregoing protruded boards correspondingly disposed at the four corners, the two internal sides or each internal side of a rectangular or wide L-shaped hole formed in the middle of the base body.

The grooves disposed at both sides or each internal side or at four corners of the base body are made after the rectangular or wide L-shaped hole is punched in the middle of the base body, but the grooves should be at least 0.03~0.10 mm larger than the protruded boards disposed at the four corners or the external edges of the plate body.

After the plate body of the cover plate and the base body of the base are engaged with each other, a plurality of dot-shaped molding tools are used in the final stamping process to simultaneously stamp a dot-shaped pit disposed in the middle of each protruded board at the four corners and external edges of the plate body thereof, such that the external periphery of each protruded board can be naturally expanded (because of the stamping process to form the dot-shaped pit) and tightly fixed into each groove disposed at the four corners and the internal sides of the rectangular or wide L-shaped hole of the base, and the cover plate and the base can be secured integrally. Moreover, each protruded board further comprises a protruded dot on the lower side of the dot-shaped pit or alternatively each protruded board comprises a pit on the lower side of a dot-shaped protrusion disposed in the middle of the protruded board.

As for the shape of the protruded board disposed at the four corners and external edges of the cover plate, it could be in any one of the circular, elliptical, long circular, flat circular, oval, rectangular, rhombus, trapezium and polygonal shapes.

The plate body of the cover plate and the base body of the base are integrated with each other because a protruded dot disposed in the middle of each protruded board is stamped and leveled at the four corners and external edges of the plate body, such that the external periphery of the protruded board is naturally expanded (because of the stamping and leveling process to make the protruded board a flat surface) and secured to each groove disposed at the four corners and the internal edges of a rectangular or wide L-shaped hole of the base, so as to integrate the cover plate with the base securely.

A cap having reverse U-shaped longitudinal and transversal cross sections is provided to cover on the base for resuming the covered state when it is necessary to maintain an electronic or a computer component covered by the isolating cover, the cover plate is pried open and removed from the base.

BRIEF DESCRIPTION OF THE DRAWINGS

The present invention will now be described in more detail hereinafter with reference to the accompanying drawings that show various embodiments of the invention, in which.

DETAILED DESCRIPTION OF THE PREFERRED EMBODIMENTS

Figure 1:
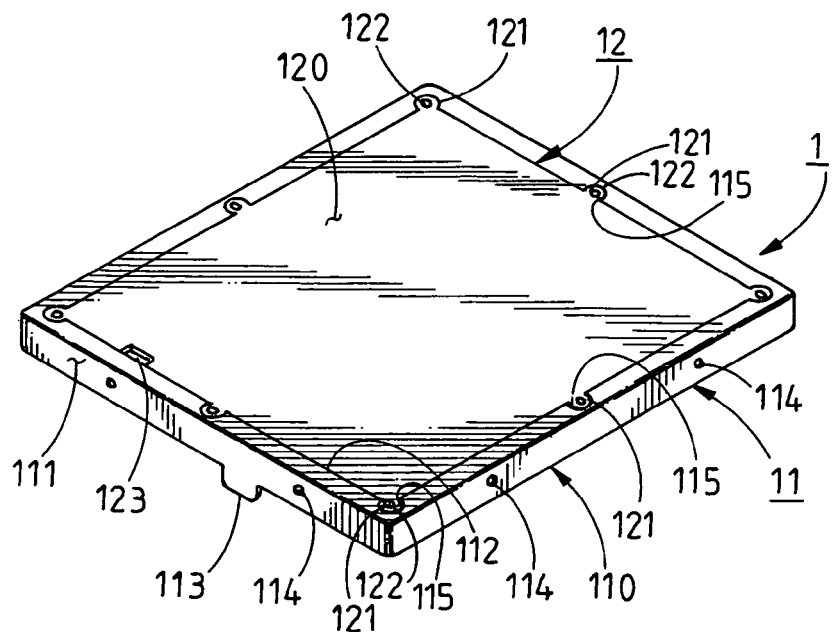
FIG. 1 is a perspective view of an isolating cover of a first preferred embodiment of the present invention.
Figure 2:
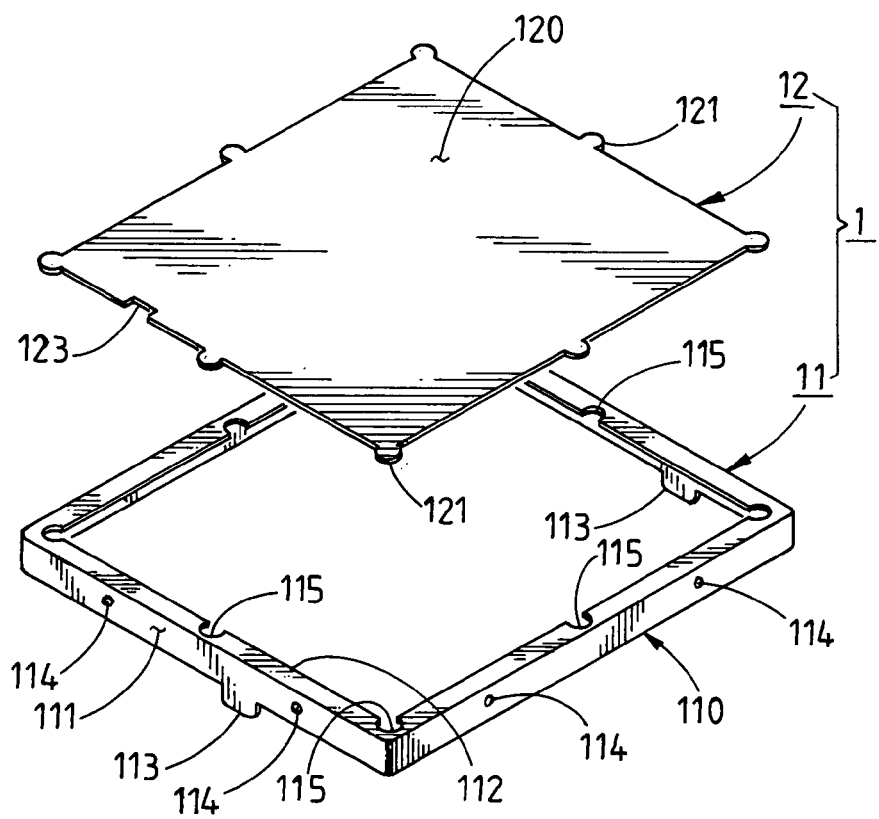
FIG. 2 is an exploded view of an isolating cover of a first preferred embodiment of the present invention.

Referring to FIGS. 1 and 2 for the manufacturing method of an isolating cover 1 of the present invention, a continuous mold, a metal sheet, and a consistent stamping process are needed. A cover plate 12 and a base 11 are manufactured separately as shown in FIG. 2. Through a consistent punching/stamping process and a continuous mold, a base 11 is manufactured by punching a metal sheet to form a rectangular or wide L-shaped hole 112 in the middle of the base; after the metal sheet is punched, the remaining part of the metal sheet is directly used as a plate body 120 of the cover plate 12. In the last stamping process, the two components (the base 11 and cover plate 12) are engaged and stamped integrally (as shown in FIG. 1) to produce an isolating cover 1 to be installed directly to a mobile phone or similar product.

The base 11 of the isolating cover 1 includes a base body 110 formed by four inverted-L-shaped frame members 111, at least one small protruded dot 114 disposed at each external side of the frame members 111 of the base body 110, and at least one pair of soldered pins 113 disposed at the lower edge of the frame members 111. This basic structure is the same as the seat member 210 of the base 21 of the prior art isolating cover 2.

However, the present invention improves the manufacturing process as follow: After one metal sheet is punched to form the base 11 having the rectangular or wide L-shaped hole 112 in the middle thereof, the remaining part of the metal sheet (i.e. the rectangular or wide L-shaped metal sheet) is used as a plate body 120 of the cover plate 12 and engaged integrally to the base body 110 of the base 11. Unlike the prior art that the remaining part of the metal sheet is dumped away, the present invention keeps the remaining part of the metal sheet. The plate body 120 of the cover plate 12 is not simply a rectangular or wide L-shaped plate body, but it includes a protruded board 121 respectively disposed at four corners, at two external edges, or at each external edge. The plate body 120 includes a notch 123 disposed at an external edge thereof for prying open the cover plate 12. The base body 110 of the base 11 includes a groove 115 respectively disposed at four corners, two internal edges, or each internal edge of the rectangular or wide L-shaped hole 112 corresponding to the protruded board 121 of the cover plate 12. In the meantime, each groove 115 on the internal edge of the rectangular or wide L-shaped hole 112 in the middle of the base 11 is stamped by a continuous mold to expand at least 0.03~0.10 mm larger than the protruded board 121 disposed at four corners or the external edges of the plate body 120 for facilitating to engage the plate body 120 of the cover plate 12 with the rectangular or wide L-shaped hole 112 in the middle of the base body 110 of the base 11.

If the plate body 120 of the cover plate 12 is engaged with the base body 110 of the base 11, a plurality of dot-shaped molding tools are used in the final stamping process to simultaneously stamp the middle of the plurality of protruded boards disposed at the four corners and external edges of the plate body 120 such that each protruded board 121 forms a dot-shaped pit 122 disposed in the middle as shown in FIG. 1, and the external periphery of the protruded board 121 is naturally expanded (because of the stamping process to form the dot-shaped pit 122) and engaged tightly into each groove 115 disposed at the four corners or the internal edges of the rectangular or wide L-shaped hole 112 of the base body 110 of the base, such that the cover plate 12 and the base 11 are integrated securely to form an isolating cover 1 as shown in FIG. 1 and the isolating cover 1 is installed directly to a general mobile phone or similar product by manufacturers.

The isolating cover 1 of the present invention also comprises at least one pair of soldered pins 113 disposed at the lower edge of the frame members 111 of the base body 110 of the base 11 and soldered on a baseboard of a mobile phone or a similar product. If it is necessary to maintain or repair an electronic or a computer component covered by the isolating cover 1, a screwdriver is inserted into the notch 123 on the external edge of the plate body 120 of the cover plate 12 to pry the cover plate 12 open and remove it from the base 11, and the plate body 120 is torn and discarded in order to perform a maintenance or a repair to the electronic or computer component. After the maintenance or repair is completed, it is necessary to prepare a cap 3 as shown in FIG. 3 for covering the base 11 and the electronic or computer component to resume the covered state in FIG. 4.

Figure 3:
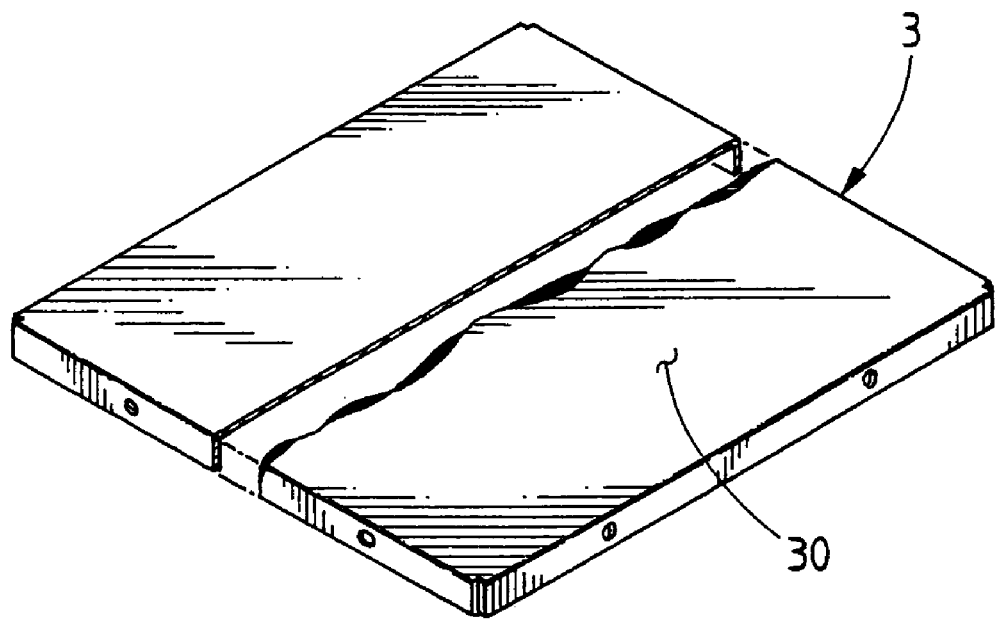
FIG. 3 is a perspective view and a partial cross-sectional view of a cap after a maintenance job according to the present invention.

Although it is necessary to prepare a cap 3 for installing the isolating cover 1 according to the present invention, another mold is needed to stamp a cover member 30 having reverse U-shaped longitudinal and transversal cross sections as shown in FIG. 3. Since the defective rate of a general mobile phone or similar product is less than 1%, therefore only one cap 3 is needed for every one hundred isolating covers 1. Compared with the prior art, the isolating cover 1 of the present invention can save at least 50% of the material and production costs for the cap 3.

Figure 5:
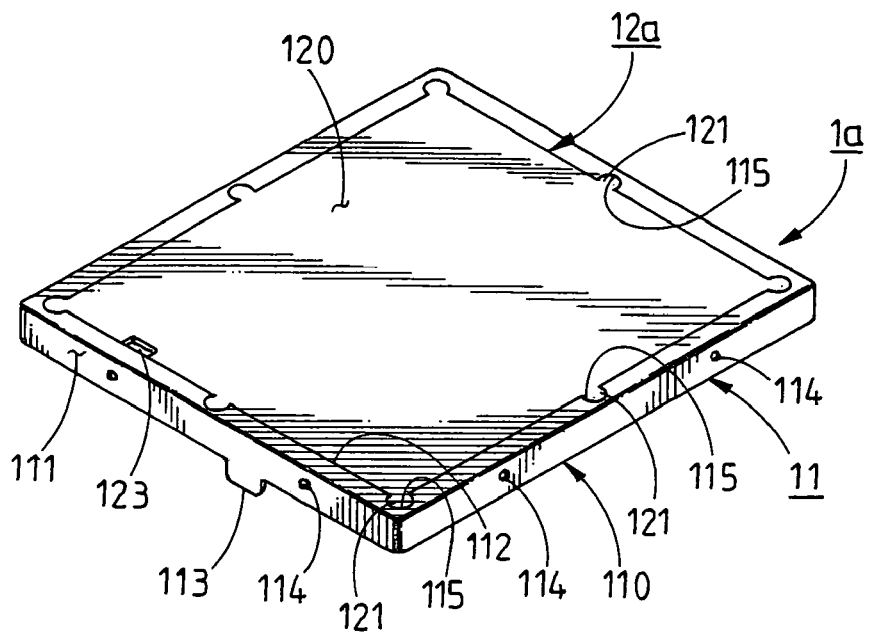
FIG. 5 is a perspective view of an isolating cover of a second preferred embodiment of the present invention.
Figure 6:
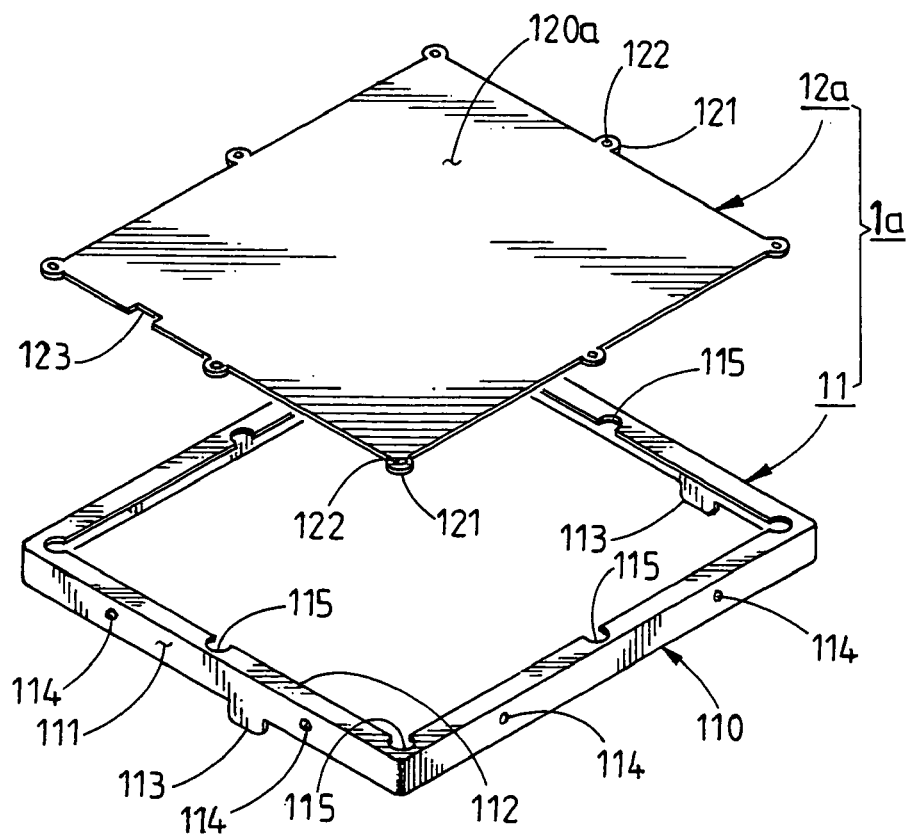
FIG. 6 is an exploded view of an isolating cover of a second preferred embodiment of the present invention.
Figure 7:
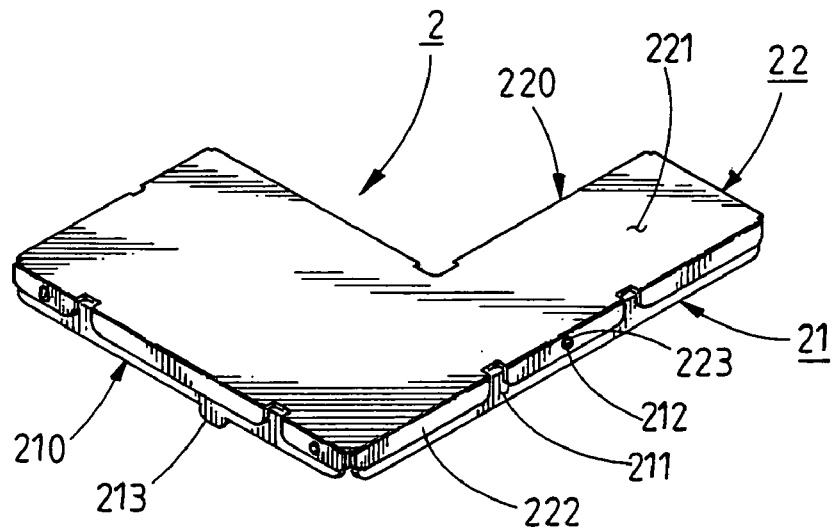
FIG. 7 is a perspective view of a prior art isolating cover.
Figure 8:
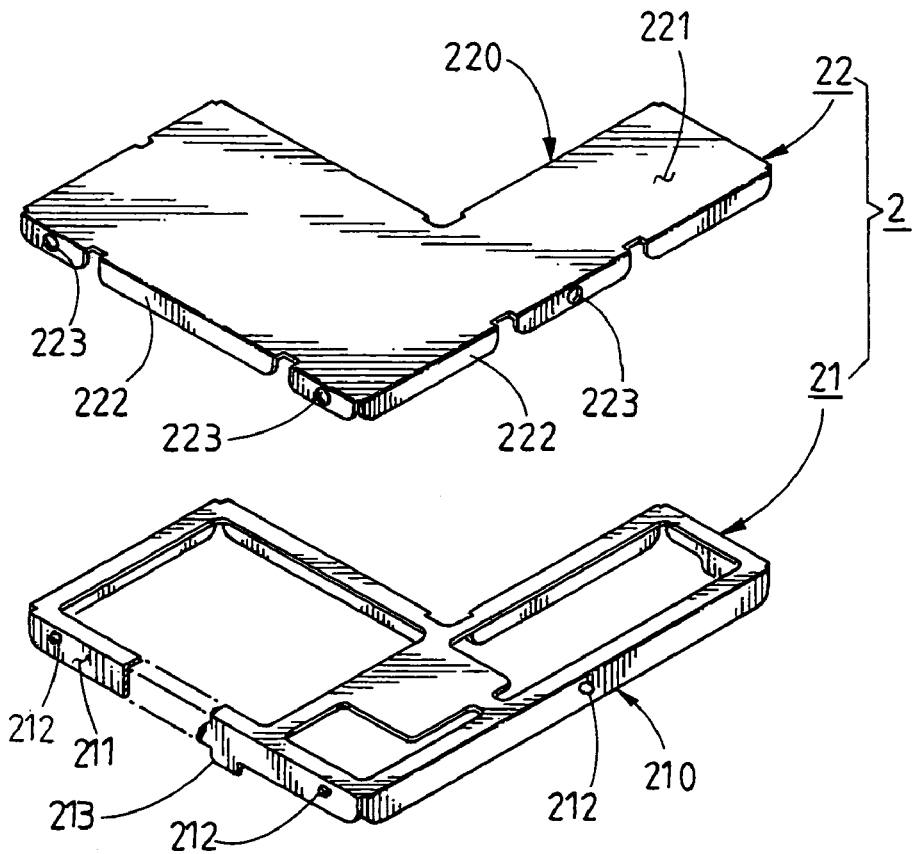
FIG. 8 is an exploded view of a prior art isolating cover.

Referring to FIGS. 5 and 6 for a perspective view and an exploded view of an isolating cover 1a according to another preferred embodiment of the invention herein, the manufacturing method and structure of the isolating cover 1a are basically the same as the isolating cover 1 according to the foregoing preferred embodiment, and the difference resides on that the plate body 120a of the cover plate 12a includes a dot-shaped pit 122 having a protruded dot disposed on the lower side of each protruded board 121 at the four corners, two external edges or each external edge of the plate body 120a or alternatively includes a dot-shaped protrusion (not shown in the figure) having a pit disposed on the lower side of each protruded board 121. After the plate body 120a of the cover plate 12a is molded and engaged back into the rectangular or wide L-shaped hole 112 in the middle of the base body 110 of the base 11, a slab mold is used to simultaneously stamp the protruded dots on the lower side of the protruded boards 121, such that the external periphery of each protruded board 121 is naturally expanded (because of the stamping and leveling process to make the protruded board a flat surface) and engaged tightly into the groove 115 at the four corners or the internal edge of the rectangular or wide L-shaped hole 112 of the base 11, thereby integrating the cover plate 12a with the base 11 to form an isolating cover 1a according to another preferred embodiment of the present invention as shown in FIG. 5.

Figure 4:
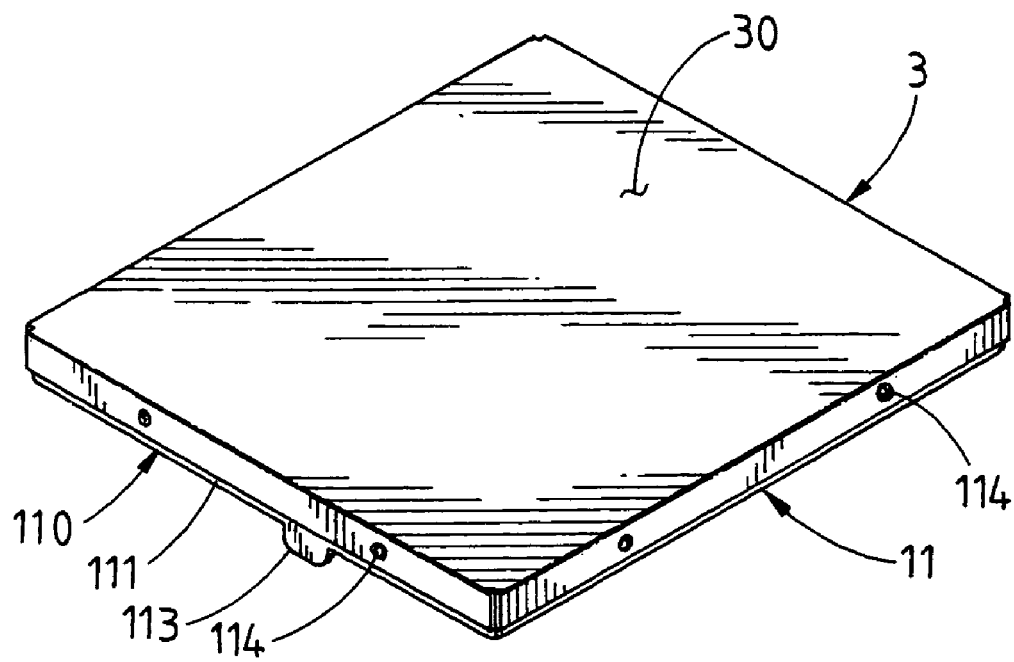
FIG. 4 is a perspective view of an isolating cover being covered by a cap after a maintenance job according to the present invention.

The installation, maintenance and repair of the isolating cover 1a and the state of the installed cap 3 as shown in FIG. 3 are the same as those illustrated in FIG. 4, and thus will not be described here.

According to the isolating cover 1, 1a of the aforementioned two preferred embodiments of the present invention, the protruded boards 121 disposed at the four corners and external edges of the plate body 120, 120a are preferably in an approximately circular shape as shown in FIGS. 2 and 6. The corresponding grooves 115 at four corners or the internal edges of the rectangular or wide L-shaped hole 112 of the base body 110 are preferably in an approximately circular shape that facilitates the molding and manufacturing process. Of course, the protruded board 121 and the groove 115 also could be in one of the elliptical, long circular, flat circular, oval, rectangular, rhombus, trapezium and polygonal shapes.

The invention claimed is:

1. An isolating cover comprising:
  a cover plate having a plate body, wherein a plurality of protruded boards are disposed at four corners, at two external edges or at each external edge thereof, and a notch is disposed at an external edge thereof for prying open said plate body;
  a base defining a base body which is provided with a rectangular or wide L-shaped hole corresponding to said plate body, wherein said plate body is engaged and integrated with said rectangular or wide L-shaped hole of said base body; and
  a plurality of grooves having the same shape and size as said protruded boards disposed at four corners, at two internal edges, or at each internal edge of said rectangular or wide L-shaped hole;
  wherein each of said protruded boards has a dot-shaped pit having a protruded dot on the lower side thereof or alternatively a pit on the lower side of a dot-shaped protrusion disposed in the middle of each of the protruded boards.

2. The isolating cover as in claim 1, wherein said protruded dot disposed on the lower side of each of said protruded boards is stamped at the four corners and external edges of said plate body such that the external periphery of each of said protruded boards naturally expands during the stamping process of the protruded dot and is secured to said grooves respectively disposed at the four corners and the internal edges of said rectangular or wide L-shaped hole of said base, thereby integrating said cover plate with said base securely.

3. The isolating cover as in claim 1, wherein said dot-shaped protrusion is stamped in the middle of said protruded boards at the four corners and the external edges of said plate body, thereby the external periphery of each of said protruded boards naturally expands during the stamping process of the dot-shaped protrusion and is engaged tightly into each of said grooves at the four corners and the internal edges of said rectangular or wide L-shaped hole of said base such that said cover plate is engaged integrally with said base.

* * * * *